(12) United States Patent
Yu et al.

(10) Patent No.: US 9,240,393 B2
(45) Date of Patent: Jan. 19, 2016

(54) HIGH YIELD SEMICONDUCTOR DEVICE

(71) Applicant: SANDISK INFORMATION TECHNOLOGY (SHANGHAI) CO., LTD., Shanghai (CN)

(72) Inventors: Cheeman Yu, Fremont, CA (US); Zhong Lu, Shanghai (CN); Gursharan Singh, Fremont, CA (US); Wei Gu, Shanghai (CN)

(73) Assignee: SanDisk Information Technology (Shanghai) Co., Ltd., Shanghai (CN)

( * ) Notice: Subject to any disclaimer, the term of this patent is extended or adjusted under 35 U.S.C. 154(b) by 0 days.

(21) Appl. No.: 14/450,005

(22) Filed: Aug. 1, 2014

(65) Prior Publication Data

US 2015/0061157 A1   Mar. 5, 2015

(30) Foreign Application Priority Data

Aug. 30, 2013   (CN) .......................... 2013 1 0386708

(51) Int. Cl.
| | |
|---|---|
| *H01L 25/065* | (2006.01) |
| *H01L 23/31* | (2006.01) |
| *H01L 25/00* | (2006.01) |
| *H01L 21/66* | (2006.01) |

(52) U.S. Cl.
CPC ........ *H01L 25/0657* (2013.01); *H01L 23/3135* (2013.01); *H01L 25/50* (2013.01); *H01L 22/14* (2013.01); *H01L 2224/04042* (2013.01); *H01L 2224/32145* (2013.01); *H01L 2224/32225* (2013.01); *H01L 2224/45139* (2013.01); *H01L 2224/45144* (2013.01); *H01L 2224/48091* (2013.01); *H01L 2224/48145* (2013.01); *H01L 2224/48227* (2013.01); *H01L 2224/49175* (2013.01); *H01L 2224/73265* (2013.01); *H01L 2224/78301* (2013.01); *H01L 2224/85205* (2013.01); *H01L 2224/92247* (2013.01); *H01L 2225/0651* (2013.01); *H01L 2225/06506* (2013.01); *H01L 2225/06562* (2013.01); *H01L 2924/15311* (2013.01); *H01L 2924/15313* (2013.01); *H01L 2924/19107* (2013.01)

(58) Field of Classification Search
CPC .. H01L 25/0657; H01L 25/50; H01L 23/3135
See application file for complete search history.

(56) References Cited

U.S. PATENT DOCUMENTS

| | | | |
|---|---|---|---|
| 8,399,974 B1 * | 3/2013 | Huneke | .......................... 257/686 |
| 2007/0045818 A1 | 3/2007 | Kuan et al. | |
| 2008/0136007 A1 | 6/2008 | Kim et al. | |
| 2009/0140440 A1 | 6/2009 | Liu et al. | |
| 2010/0044861 A1 | 2/2010 | Chiu et al. | |
| 2010/0155918 A1 | 6/2010 | Kim | |

(Continued)

OTHER PUBLICATIONS

Office Action dated Jul. 27, 2015 in Taiwan Patent Application No. 103129085.

*Primary Examiner* — Marc Armand
*Assistant Examiner* — Wasiul Haider
(74) *Attorney, Agent, or Firm* — Vierra Magen Marcus LLP (57) ABSTRACT

A semiconductor device including two or more die stacks mounted to a substrate. The first die stack is mounted, at least partially encapsulated, and then tested. If the first die stack functions within predefined parameters, a second die stack is mounted on the first die stack, and then the device may undergo a second encapsulation process. Testing the first die stack before mounting the second improves yield by identifying faulty semiconductor die before all die are mounted within the semiconductor device.

25 Claims, 9 Drawing Sheets

(56) References Cited

U.S. PATENT DOCUMENTS

| | | |
|---|---|---|
| 2010/0314740 A1 | 12/2010 | Choi et al. |
| 2010/0327461 A1 | 12/2010 | Co et al. |
| 2011/0037158 A1 | 2/2011 | Youn et al. |
| 2011/0272825 A1* | 11/2011 | McGrath ............... H01L 21/563 257/777 |
| 2012/0007227 A1* | 1/2012 | Cho ....................... H01L 21/568 257/686 |
| 2012/0025396 A1* | 2/2012 | Liao .................. H01L 23/49822 257/777 |
| 2013/0093103 A1* | 4/2013 | Kim et al. ...................... 257/777 |
| 2013/0148401 A1* | 6/2013 | Fai et al. .......................... 365/63 |
| 2015/0014834 A1* | 1/2015 | Teng et al. ..................... 257/676 |

\* cited by examiner

HIGH YIELD SEMICONDUCTOR DEVICE

BACKGROUND

The strong growth in demand for portable consumer electronics is driving the need for high-capacity storage devices. Non-volatile semiconductor memory devices, such as flash memory storage cards, are becoming widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs and cellular telephones.

While many varied packaging configurations are known, flash memory storage cards may in general be fabricated as system-in-a-package (SiP) or multichip modules (MCM), where a plurality of die are mounted and interconnected on a small footprint substrate. The substrate may in general include a rigid, dielectric base having a conductive layer etched on one or both sides. Electrical connections are formed between the die and the conductive layer(s), and the conductive layer(s) provide an electric lead structure for connection of the die to a host device. Once electrical connections between the die and substrate are made, the assembly is then typically encased in a molding compound which provides a protective package.

Figure 1:
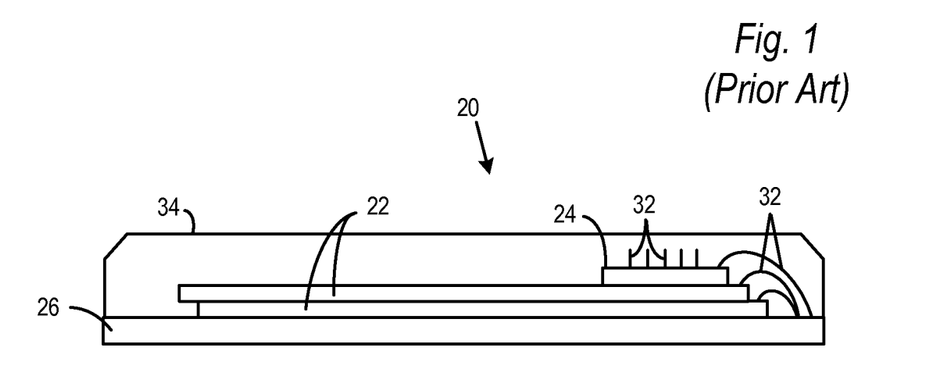
FIG. 1 is a cross-sectional side view of a conventional semiconductor package.
Figure 2:
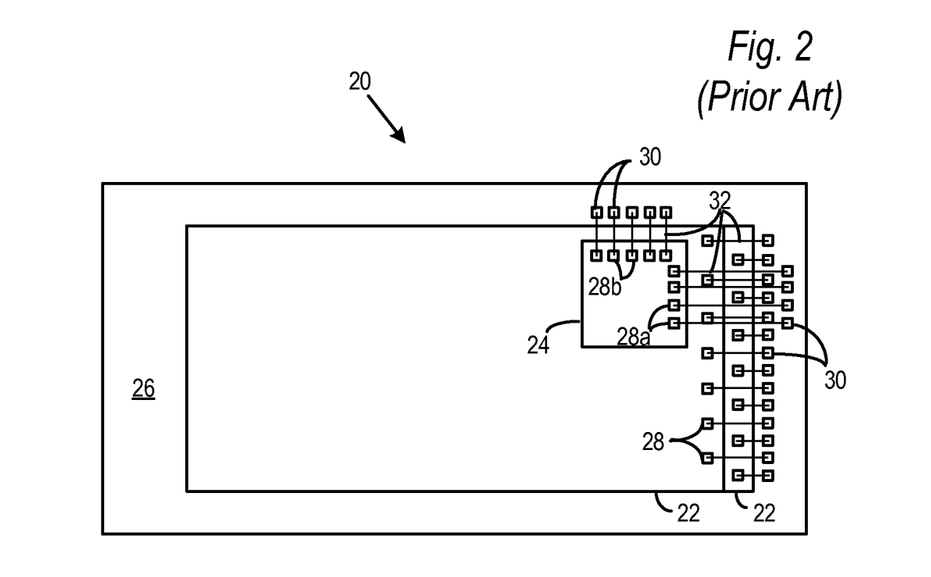
FIG. 2 is a top view of a conventional substrate and wire bonded semiconductor die.

A cross-sectional side view and a top view of a conventional semiconductor package 20 are shown in FIGS. 1 and 2 (without molding compound in FIG. 2). Typical packages include a plurality of semiconductor die, such as flash memory die 22 and controller die 24, affixed to a substrate 26. A plurality of die bond pads 28 may be formed on the semiconductor die 22, 24 during the die fabrication process. Similarly, a plurality of contact pads 30 may be formed on the substrate 26. Die 22 may be affixed to the substrate 26, and then die 24 may be mounted on die 22. All die may then be electrically coupled to the substrate by affixing wire bonds 32 between respective die bond pad 28 and contact pad 30 pairs. Once all electrical connections are made, the die and wire bonds may be encapsulated in a molding compound 34 to seal the package and protect the die and wire bonds.

In order to most efficiently use package footprint, it is known to stack semiconductor die on top of each other, either completely overlapping each other with a spacer layer in between adjacent die, or with an offset as shown in FIGS. 1 and 2. In an offset configuration, a die is stacked on top of another die so that the bond pads of the lower die are left exposed. An offset configuration provides an advantage of convenient access of the bond pads on each of the semiconductor die in the stack.

As semiconductor die become thinner, and in order to increase memory capacity in semiconductor packages, the number of die in the die stack of a semiconductor package continues to increase. One problem this presents is that when a single die fails during test of the die stack, the whole die stack is typically discarded. It becomes important to improve yield in order to make large die stacks worthwhile.

DETAILED DESCRIPTION

The present technology will now be described with reference to FIGS. 3 through 18, which in embodiments, relate to a semiconductor device including intermediate die stacks which may be tested and encapsulated prior to mounting of an additional die stack. It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

The terms "top" and "bottom," "upper" and "lower" and "vertical" and "horizontal" as may be used herein are by way of example and illustrative purposes only, and are not meant to limit the description of the invention inasmuch as the referenced item can be exchanged in position and orientation. Also, as used herein, the terms "substantially," "approximately" and/or "about" mean that the specified dimension or parameter may be varied within an acceptable manufacturing tolerance for a given application. In one embodiment, the acceptable manufacturing tolerance is ±0.25%.

An embodiment of the present invention will now be explained with reference to the flowchart of FIG. 3 and the top and side views of FIGS. 4 through 12. Although FIGS. 4 through 18 each show an individual device 100, or a portion thereof, it is understood that the device 100 may be batch processed along with a plurality of other packages 100 on a substrate panel to achieve economies of scale. The number of rows and columns of packages 100 on the substrate panel may vary.

Figure 4:
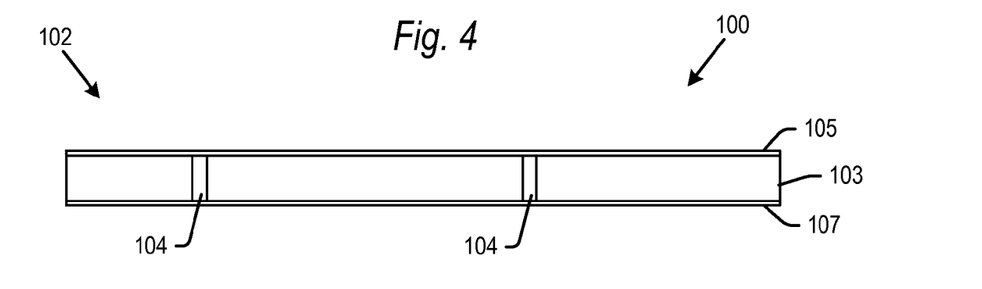
FIG. 4 is a side view of a semiconductor device at a first step in the fabrication process according to an embodiment of the present technology.
Figure 5:
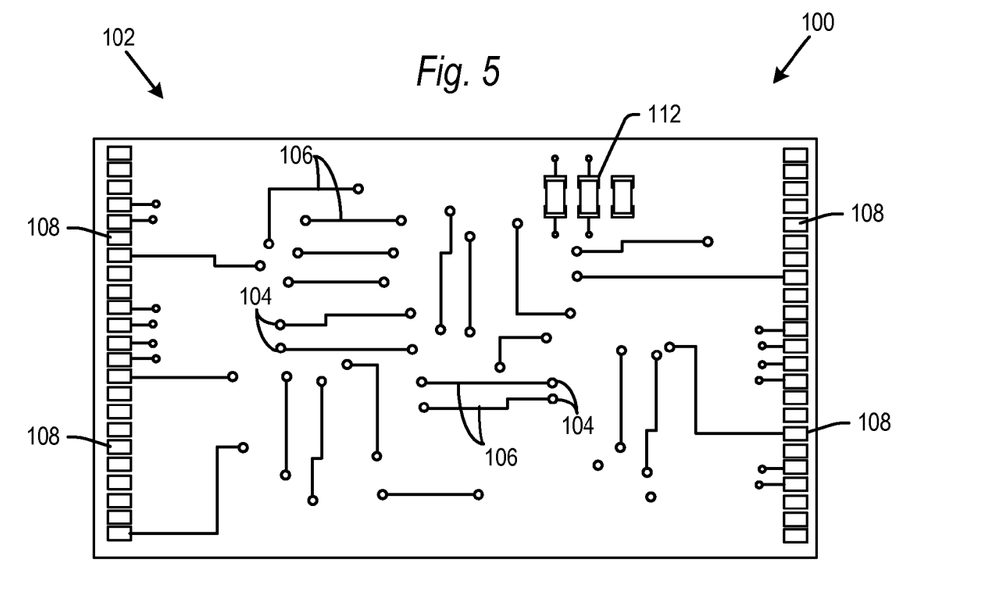
FIG. 5 is a top view of a semiconductor device at a second step in the fabrication process according to an embodiment of the present technology.
Figure 6:
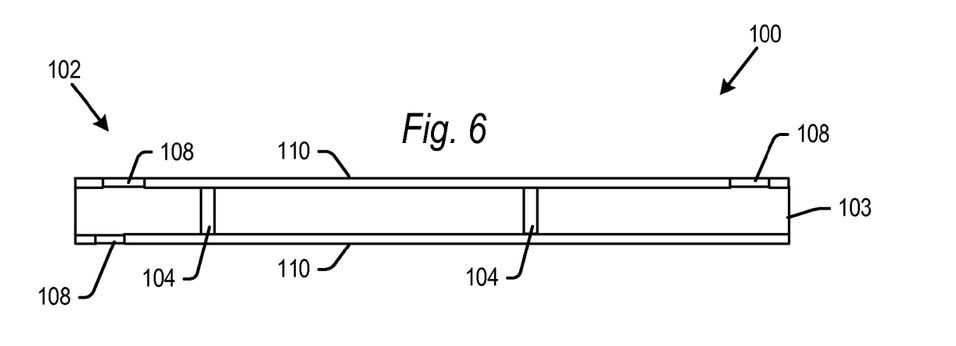
FIG. 6 is a side view of a semiconductor device at a third step in the fabrication process according to an embodiment of the present technology.

The substrate panel begins with a plurality of substrates 102 (again, one such substrate is shown in FIGS. 4 through 18). The substrate 102 may be a variety of different chip carrier mediums, including a printed circuit board (PCB), a leadframe or a tape automated bonded (TAB) tape. Where substrate 102 is a PCB, the substrate may be formed of a core 103 having a top conductive layer 105 and a bottom conductive layer 107 as indicated in FIG. 4. The core 103 may be formed of various dielectric materials such as for example, polyimide laminates, epoxy resins including FR4 and FR5, bismaleimide triazine (BT), and the like. Although not critical to the present invention, the core may have a thickness of between 40 microns (μm) to 200 μm, although the thickness of the core may vary outside of that range in alternative embodiments. The core 103 may be ceramic or organic in alternative embodiments.

The conductive layers 105, 107 surrounding the core may be formed of copper or copper alloys, plated copper or plated copper alloys, Alloy 42 (42Fe/58Ni), copper plated steel, or other metals and materials known for use on substrate panels. The conductive layers may have a thickness of about 10 μm to 25 μm, although the thickness of the layers may vary outside of that range in alternative embodiments.

Figure 3:
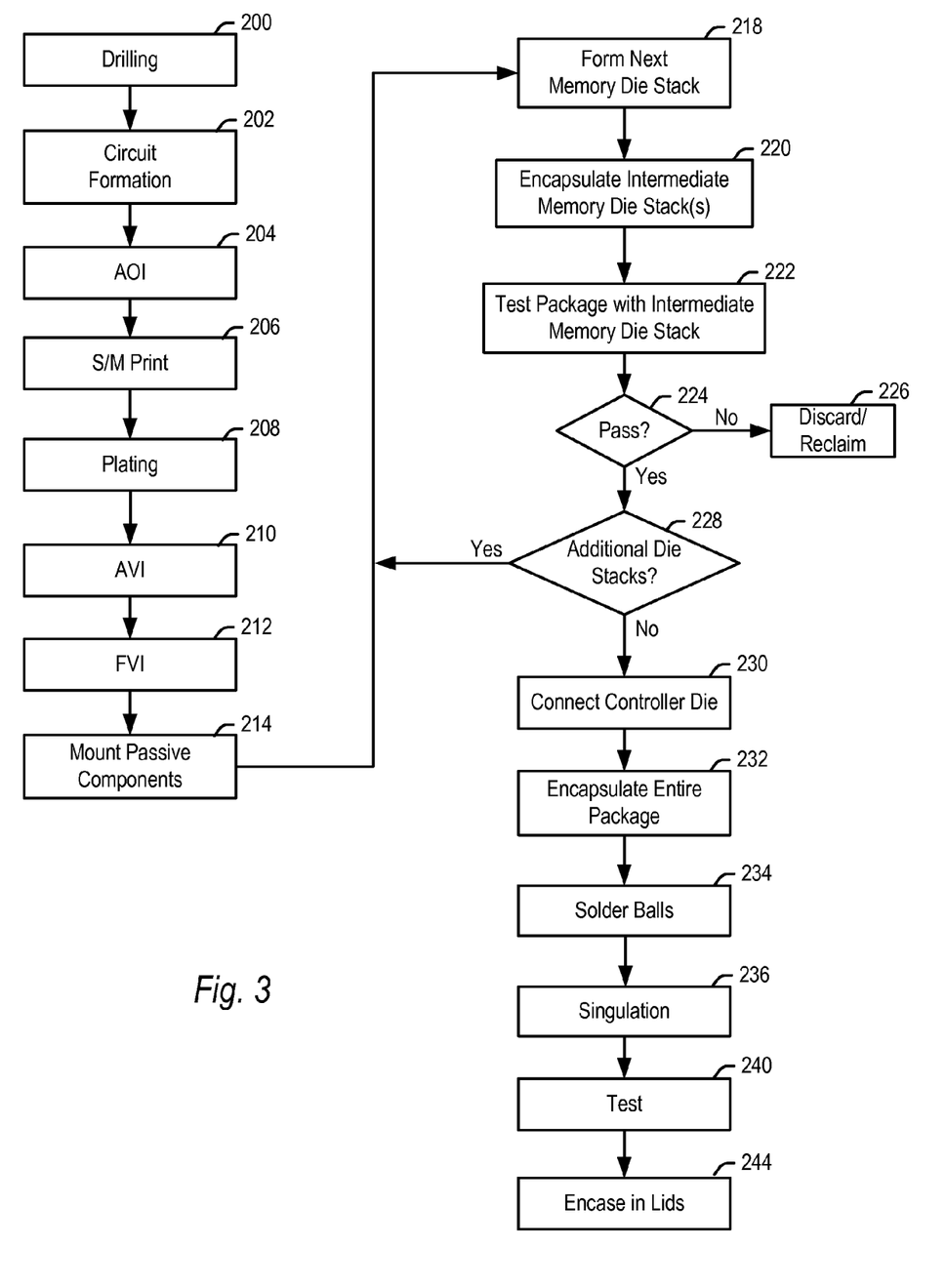
FIG. 3 is a flowchart of the overall fabrication process of semiconductor device according to embodiments of the present invention.

FIG. 3 is a flowchart of the fabrication process for forming a semiconductor device according to embodiments of the present invention. In a step 200, the substrate 102 may be drilled to define through-hole vias 104 in the substrate 102. The vias 104 (only some of which are numbered in the figures) are by way of example, and the substrate 102 may include many more vias 104 than are shown in the figures, and they may be in different locations than are shown in the figures. Conductance patterns are next formed on one or both of the top and bottom conductive layers in step 202. The conductance pattern(s) may include electrical traces 106 and contact pads 108 as shown for example in FIGS. 5 and 6. The traces 106 and contact pads 108 (only some of which are numbered in the figures) are by way of example, and the substrate 102 may include more traces and/or contact pads than is shown in the figures, and they may be in different locations than is shown in the figures.

In embodiments, the finished semiconductor device 100 assembly may be used as a BGA (ball grid array) package. A lower surface of the substrate 102 may include contact pads 108 for receiving solder balls as explained below. In further embodiments, the finished semiconductor device 100 may be an LGA (land grid array) package including contact fingers for removably coupling the finished device 100 within a host device. In such embodiments, the lower surface may include contact fingers instead of the contact pads that receive solder balls. The conductance pattern on the top and/or bottom surfaces of the substrate 102 may be formed by a variety of known processes, including for example various photolithographic processes.

Referring again to FIG. 3, the substrate 102 may then be inspected in an automatic optical inspection (AOI) in step 204. Once inspected, a solder mask 110 may be applied to the substrate in step 206. After the solder mask is applied, the contact pads, contact fingers and any other solder areas on the conductance patterns may be plated with a Ni/Au, Alloy 42 or the like in step 208 in a known electroplating or thin film deposition process. The substrate 102 may then be inspected and tested in an automated inspection process (step 210) and in a final visual inspection (step 212) to check electrical operation, and for contamination, scratches and discoloration.

Assuming the substrate 102 passes inspection, passive components 112 may next be affixed to the substrate in a step 214. The one or more passive components may include for example one or more capacitors, resistors and/or inductors, though other components are contemplated. The passive components 112 (only one of which is numbered in the figures) shown are by way of example only, and the number, type and position may vary in further embodiments.

In accordance with the present technology, die stacks may next be affixed on the substrate in a way that allows a first group of die to be mounted, encapsulated and tested, and then a second group of die mounted, the whole package encapsulated, and then tested. This allows for high yield in a package including a large number of semiconductor die (though, in embodiments, the principles of the present technology may be applied to a package having a small number of semiconductor die. Testing the first die stack before mounting the second improves yield by identifying faulty semiconductor die before all die are mounted within the semiconductor device.

Figure 7:
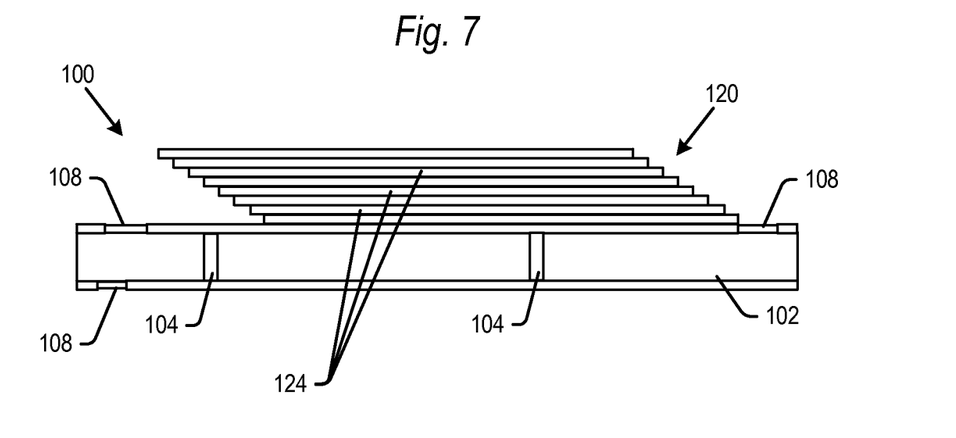
FIG. 7 is a side view of a semiconductor device at a fourth step in the fabrication process according to an embodiment of the present technology.
Figure 8:
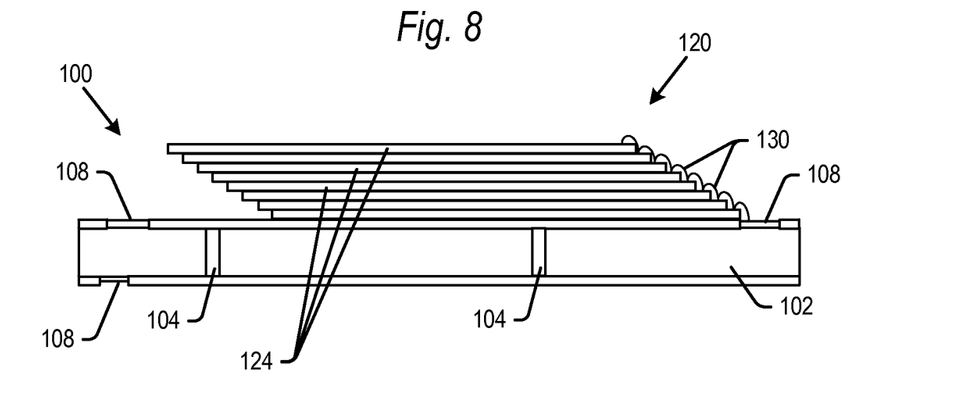
FIG. 8 is a side view of a semiconductor device at a fifth step in the fabrication process according to an embodiment of the present technology.

In step 218, a first die stack 120 including a number of semiconductor die 124 may be formed on the substrate 102. Forming here refers to affixing the die onto the substrate in a stack, as shown in FIG. 7, and then wire bonding the semiconductor die to each other and the substrate with wire bonds 130 as shown in FIG. 8. The die may be stacked in an offset (stepped) configuration as shown in FIGS. 7 and 8. The die may be affixed to the substrate and/or each other using a die attach film. As one example, the die attach adhesive may be 8988UV epoxy from Henkel AG & Co. KGaA, cured to a B-stage to preliminarily affix the die 124 in the stack 120, and subsequently cured to a final C-stage to permanently affix the die 124 in the stack 120.

The semiconductor die 124 may for example be memory die such a NAND flash memory die, but other types of die 124 may be used. FIG. 7 shows an embodiment where eight die 124 are mounted in stack 120. However, there may be more or less than eight die 124 in stack 120 in further embodiments. As further examples, the die stack 120 may include four or six memory die.

Figure 9:
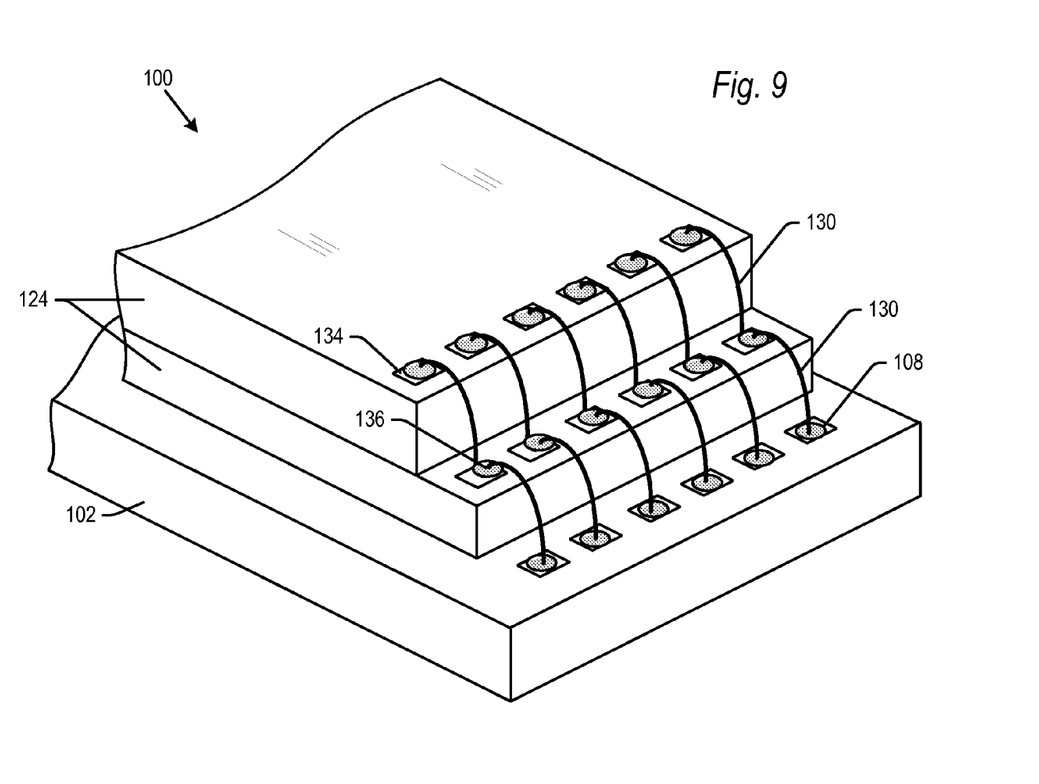
FIG. 9 is a simplified perspective view of a semiconductor device at the fifth step in the fabrication process according to an embodiment of the present technology.

Referring now to side view of FIG. 8, once the die stack 120 is formed, the respective die 124 in the stack 120 may be electrically connected to each other and the substrate 102 using wire bonds 130. FIG. 9 is a simplified perspective view showing the substrate 102 and only the bottom two die 124 in die stack 120. As shown, each semiconductor die 124 may include a row of die bond pads 134 along an edge of the die 124. It is understood that each die 124 may include many more die bond pads 134 than is shown in FIG. 9. Each die bond pad 134 in the row of a semiconductor die may be electrically connected to the corresponding die bond pad 134 in the row of the next adjacent semiconductor die using a wire bond 130. Each die bond pad 134 of the bottom semiconductor die 124 may be electrically connected to the corresponding contact pad 108 in the row of contact pads on substrate 102 using a wire bond 130.

Although wire bonds 130 may be formed by a variety of technologies, in one embodiment, the wire bonds 130 may be formed as reverse ball bonds. These may be fashioned by first depositing a ball bond 134 on die bond pads of a die, such as bottom die 124, using a wire bonding capillary of known construction (not shown). The ball bonds 136 (one of which is numbered in FIG. 9) may be formed by feeding a length of wire (typically gold or silver alloy) through a central cavity of the wire bonding capillary. The wire protrudes through a tip of the capillary, where a high-voltage electric charge is applied to the wire from a transducer associated with the capillary tip. The electric charge melts the wire at the tip and the wire forms into a ball 136 owing to the surface tension of the molten metal. The ball 136 may then be affixed to a die bond pad 134 under a load, while the transducer applies ultrasonic energy.

The wire bonding capillary may then pay out a small length of wire, and the wire may be severed at the conductive ball to leave the ball bond 136 on the die bond pad 134. The small tail of wire hanging from the end of the capillary may then be used to form the ball bond 136 for the next subsequent die bond pad 134 in the row. Ball bonds 136 may be formed at the bond pads of semiconductor die 124 by a variety of other methods including for example stud bumping or gold bumping at the wafer level, or by a variety of other methods.

Thereafter, another ball bond is formed on the next lower level (for example on substrate 102) as explained above. However, instead of severing the wire, the wire is payed out and brought into contact with a corresponding ball bond 136 on the next higher level (though one or more levels may be skipped in further embodiments). The wire is applied to the ball bond 136 under a load, while the transducer applies ultrasonic energy. The combined heat, pressure, and ultrasonic energy create a bond between the wire and ball bond 136. The wire bonding capillary may then pay out a small length of wire, and the wire may be severed to form the wire bond 130 between corresponding pads on different levels.

This process may be repeated, both horizontally across the pads on the die and substrate, and vertically between the pads on the die and substrate, until all wire bonds 130 have been formed. The order with which wire bonds 130 are formed (horizontally or vertically) may vary in different embodiments. Moreover, while the wire bonds 130 are shown generally in a straight vertical column from one layer to the next in the die stack 120 and substrate, one or more of the wire bonds may extend diagonally from one layer to the next. Further, it may be that a wire bond skips one or more layers in the die stack 120.

Figure 10:
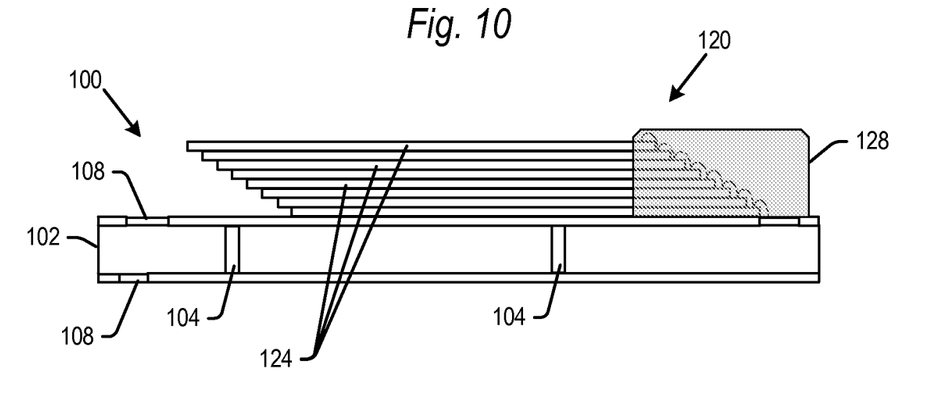
FIG. 10 is a side view of a semiconductor device at a sixth step in the fabrication process according to an embodiment of the present technology.

After the first die stack 120 is affixed and wire bonded to the substrate, a portion of the die stack 120 may be encapsulated in a mold compound 128 in step 220 as shown in FIG. 10. In embodiments, it is just a portion of stack 120 that includes the wire bonds 130 that is encapsulated in step 220. However, as explained hereinafter, any amount of die stack 120 may be encapsulated in step 220 in further embodiments, including all of die stack 120.

Mold compound 128 may include for example solid epoxy resin, Phenol resin, fused silica, crystalline silica, carbon black and/or metal hydroxide. Such mold compounds are available for example from Sumitomo Corp. and Nitto-Denko Corp., both having headquarters in Japan. Other mold compounds from other manufacturers are contemplated. The mold compound 128 may be applied according to various known processes, including by transfer molding with the mold cavity covering just the portion of the semiconductor device 100 to be encapsulated at this stage. The encapsulation process may be performed by injection molding or other techniques in further embodiments. The mold compound 128 may be applied as an A-stage or B-stage epoxy and then cured to a solid C-stage. Alternatively, the mold compound 128 may be left as a B-stage adhesive when a second die stack is attached (as explained below) and cured to a C-stage thereafter.

After encapsulation in step 220, the semiconductor device 100 including a die stack 120 may be tested in step 222. Step 222 may include one or more operations testing the functionality of respective die 124 in die stack 120, and the overall functionality of the device 100. In step 224, if the device 100 does not pass testing, i.e., does not function with defined parameters, the device 100 as shown in FIG. 10 may be discarded. Alternatively, depending on the results of the testing, device 100 may be reclaimed by disabling the one or more failed die as explained below. Detecting a failed package at this stage in packet fabrication saves device fabrication cost by preventing good die from being added to a faulty package, and improves overall yield.

Figure 11:
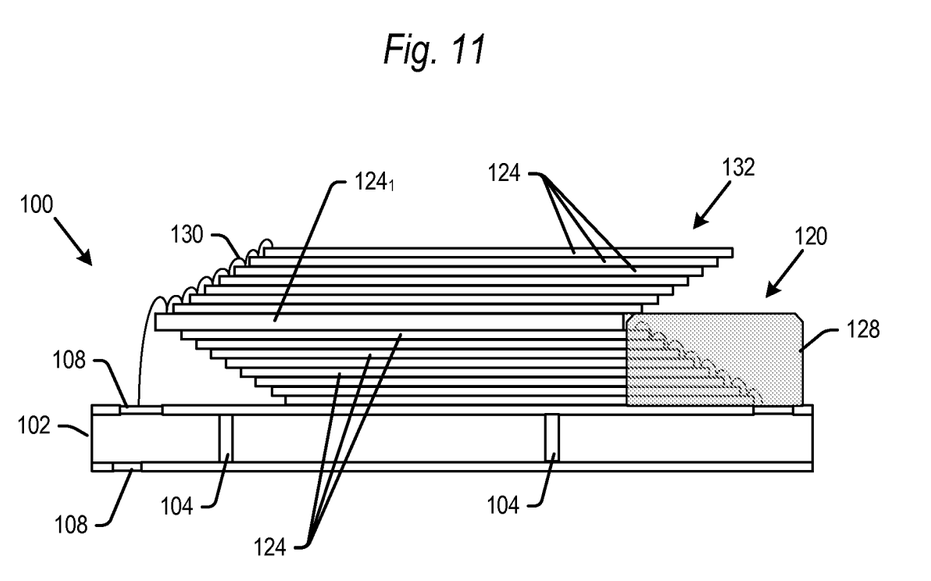
FIG. 11 is a side view of a semiconductor device at a seventh step in the fabrication process according to an embodiment of the present technology.

On the other hand, if the semiconductor device 100 shown in FIG. 10 passes testing in step 224, one or more additional die stacks may be added in step 228. In particular, in embodiments, the semiconductor device 100 may include two die stacks 120, 132 as shown in FIG. 11 described below. However, it is conceivable that more than two die stacks be formed within semiconductor device 100 with steps 218, 220, 222, 224 and 226 being repeated for each additional die stack. However, it is noted that, for the final die stack that is added, the steps 220 and 222 may be skipped. That is, there is no need to encapsulate or test the uppermost die stack in step 220, as the entire package may be encapsulated and tested after the die stacks are formed in steps 232, 240 explained below. Thus for example, where there are two die stacks, the bottom die stack may be partially encapsulated in step 220 and tested in step 222, but partial encapsulation and testing of the upper die stack may be skipped in favor of complete encapsulation and testing of the device 100 that takes place in steps 232 and 240. Where there are for example three die stacks, the first two may be partially encapsulated and tested in steps 220, 222, but these steps may be skipped for the third and final die stack.

Assuming an additional die stack is to be added in step 228, the flow may return to step 218 to form the next memory die stack, such as for example die stack 132 shown in FIG. 11. Step 218 may be repeated to add die stack 132 on top of die stack 120. In the embodiment shown in FIG. 11, the die stack 132 may be formed with a like number of die to die stack 120, but stepped in the opposite direction. Wire bonds 130 may be formed as described above, with the wire bonds off of a bottom die $124_1$ in stack 132 extending down to contact pads 108 on substrate 102. This electrically connects semiconductor die 124 in stack 132 to each other and substrate 102.

Although not shown, an interposer layer may be provided between the die stacks 120 and 132 to simplify wire bonding. The interposer may be omitted in further embodiments.

In embodiments, the bottom die $124_1$ in stack 132 may extend in a horizontal direction out beyond the uppermost die in the bottom die stack 120 so as to have an edge including the die bond pads which is not supported on a semiconductor die below it as shown in FIG. 11. In order to prevent the die $124_1$ from cracking during the wire bond process, the bottom die $124_1$ may be thicker than the rest of the die in die stack 132. In one embodiment, the die in stacks 120 and 132 (other than die $124_1$) may have a thickness of approximately 25 µm, and the die $124_1$ may be approximately 102 µm. These thicknesses are by way of example only and may vary in further embodiments. In some embodiments, the die $124_1$ may be the same thickness as the other die in stack 132.

In embodiments, the die $124_1$ may have a thickness such that it is coplanar with an upper surface of mold compound 128. Thus, the die 124 directly above the die $124_1$ may be mounted on the die $124_1$ with an edge possibly lying on top of the upper surface of mold compound 128 (as shown in FIG. 11) without creating stresses within that die. In further embodiments, the thickness of die $124_1$ may be such that the die 124 directly above the die $124_1$ may be mounted above the surface of the mold compound 128.

After mounting of the die stacks 120, 132, etc. on the substrate 102, a controller die (not shown) may be mounted and wire bonded to the substrate in step 230. In embodiments, the controller die may be mounted on the uppermost die of the uppermost die stack. In further embodiments, the controller die to be mounted beneath the lowermost die in stack 120. For example, the controller die may be mounted on top of the substrate 102. An example of such an embodiment is disclosed in Patent Cooperation Treaty Patent Application No. PCT/CN2013/070264, entitled "Semiconductor Device Including an Independent Film Layer For Embedding and/or Spacing Semiconductor Die," with an international filing date of Jan. 9, 2013. As a further example, the controller die may be mounted within the substrate 102. An example of such an embodiment is disclosed in Patent Cooperation Treaty Patent Application No. PCT/CN2013/071051, entitled "Semiconductor Device Including an Embedded Controller Die and Method of Making Same," with an international filing date of Jan. 28, 2013. Both of these international patent applications are incorporated by reference herein in their entirety.

Figure 12:
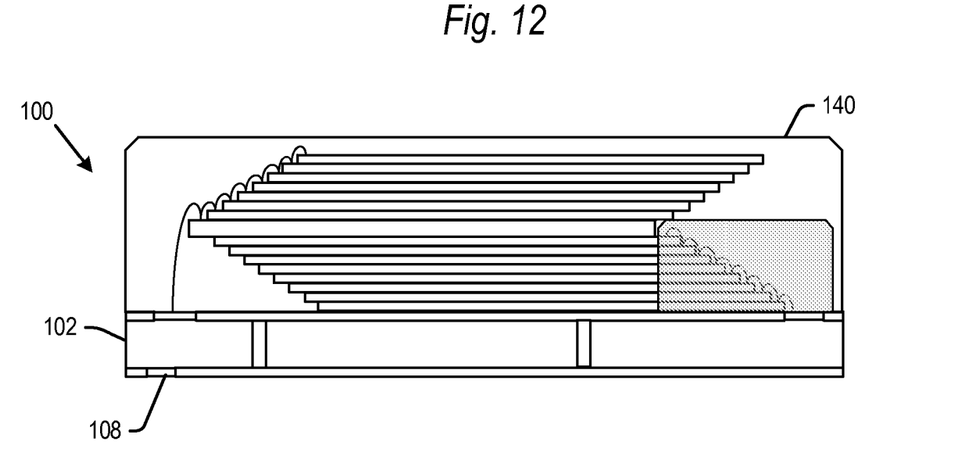
FIG. 12 is a side view of a semiconductor device at an eighth step in the fabrication process according to an embodiment of the present technology.

Following mounting and electrical connection of the die stacks 120, 132 and controller die, the die stacks, controller, wire bonds and at least a portion of the substrate may be encapsulated in a mold compound 140 in a step 232 and as shown in FIG. 12. Mold compound 140 may include for example solid epoxy resin, Phenol resin, fused silica, crystalline silica, carbon black and/or metal hydroxide. Such mold compounds are available for example from Sumitomo Corp. and Nitto-Denko Corp., both having headquarters in Japan. Other mold compounds from other manufacturers are contemplated. The mold compound may be applied according to various known processes, including by transfer molding or injection molding techniques. The encapsulation process may be performed by FFT (Flow Free Thin) compression molding in further embodiments.

The curable B-stage adhesives and resins, such as for example the die attach film between die, and possibly the mold compound 128, 140, may be cured to final cross-linked C-stage during the encapsulation step. The adhesives and/or resins may be cured to the C-stage in a separate heating step in further embodiments.

As shown in FIG. 12, after the die on the panel are encapsulated in step 232, solder balls 142 may be soldered to the contact pads 108 on a bottom surface of the respective packages in step 234 for embodiments where the device 100 is a BGA package. Where the packages are LGA packages, step 226 may be skipped.

Figure 13:
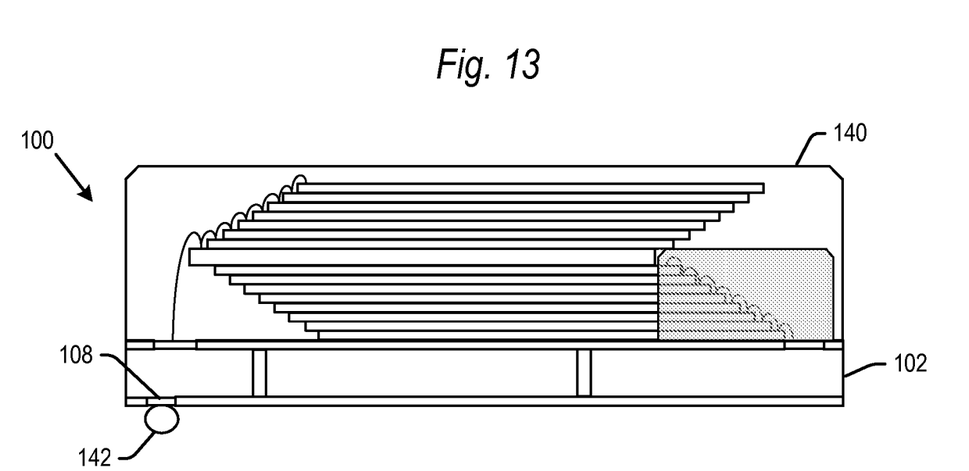
FIG. 13 is a side view of a semiconductor device at a ninth step in the fabrication process according to an embodiment of the present technology.

The respective packages may be singulated in step 236 from the panel to form the finished semiconductor device 100 shown in FIG. 12 or 13. Each semiconductor device 100 may be singulated by any of a variety of cutting methods including sawing, water jet cutting, laser cutting, water guided laser cutting, dry media cutting, and diamond coating wire cutting. While straight line cuts will define generally rectangular or square shaped semiconductor device 100, it is understood that semiconductor device 100 may have shapes other than rectangular and square in further embodiments of the present invention.

As noted above, as each die stack is added to the device 100, the operation of the die stack and device 100 may be tested. After singulation of the finished semiconductor devices 100, the devices may undergo a final test in steps 240 to determine whether the finished devices 100 are functioning properly. As is known in the art, such testing may include electrical testing, burn in and other tests. Optionally, in step 244, the finished semiconductor devices may be encased within a lid (not shown), for example where the semiconductor devices are LGA packages.

Where one or more die fail the testing steps 222 and/or 240, that die may be disabled (i.e., electrically disconnected and isolated within the die stack). This may be done by severing the chip-enable (CE) trace for that die. Thereafter, the device including the one or more disabled die may continue through the fabrication steps described herein to a completed device 100 and may be operable with less capacity than a comparable package with fully functioning die.

The finished semiconductor device 100 may for example be a memory card such as for example an MMC card, an SD card, a multiuse card, a micro-SD card, a memory stick, a compact SD card, an ID card, a PCMCIA card, an SSD card, a chip-card, a smartcard, an USB card, an MCP-type embedded card storage, or the like.

Figure 14:
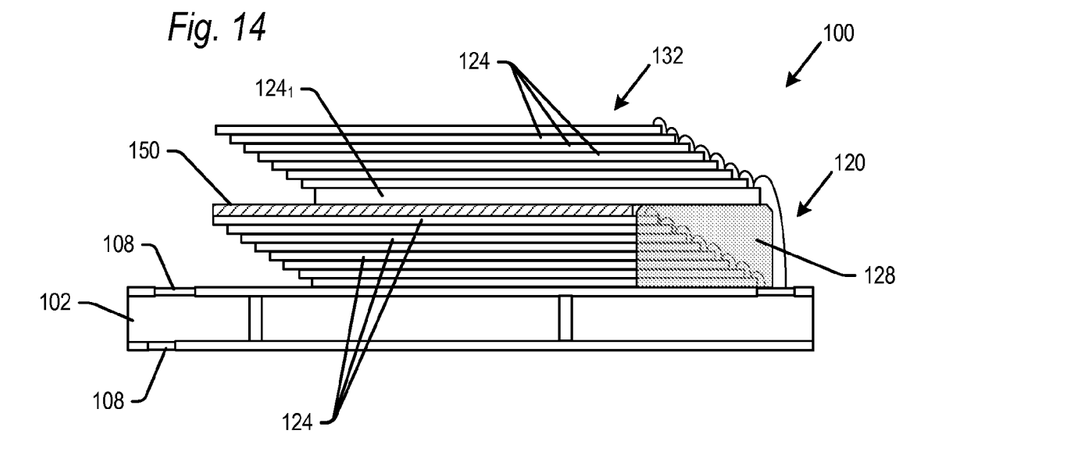
FIGS. 14-16 are side views of an alternative embodiment of the semiconductor device according to the present technology.
Figure 15:
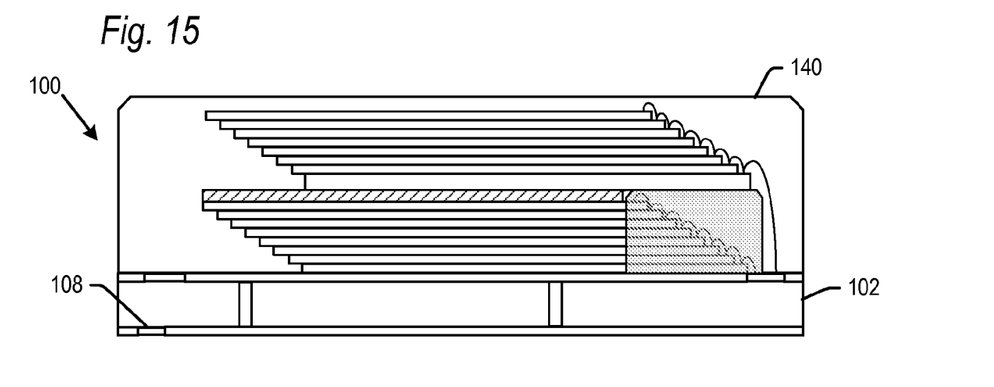
Figure 16:
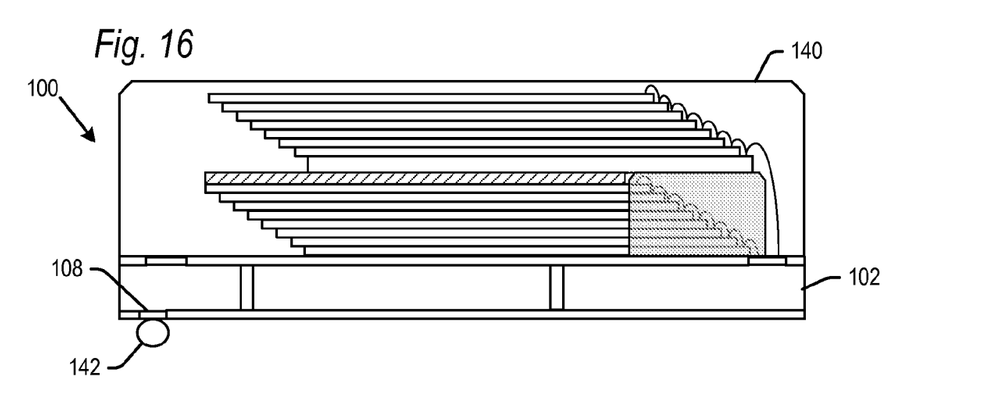

FIGS. 14-16 illustrate a further embodiment of a semiconductor device 100 according to the present technology. The device 100 of FIGS. 14-16 is similar to the device of the earlier figures, and fabricated by the same steps. However, where die stack 132 shown for example in FIG. 11 is oppositely stepped from the die stack 120, the die stack 132 in FIG. 14 is stepped in the same direction as die stack 120.

In this embodiment, the upper surface of the mold compound 128 may be higher than the surface of the upper die in die stack 120 (higher by at least the height of the wire bond off of the upper die in stack 120). In order to provide a level bonding surface for the upper die stack 132 in the embodiment of FIGS. 14-16, a spacer layer 150 may be mounted on the top die of the stack 120, to the side of the mold compound 128. The spacer layer 150 may be formed of a dielectric material, such as polyimide, and may have a thickness so that an upper surface of the spacer layer is generally coplanar with an upper surface of the mold compound 128. In embodiments, the spacer layer may be affixed prior to affixation of the second die stack 132. In the embodiment of FIGS. 14-16, the bottom die $124_1$ may be same thickness as the other die in the die stack 132, or it may be thicker as described above.

Figure 17:
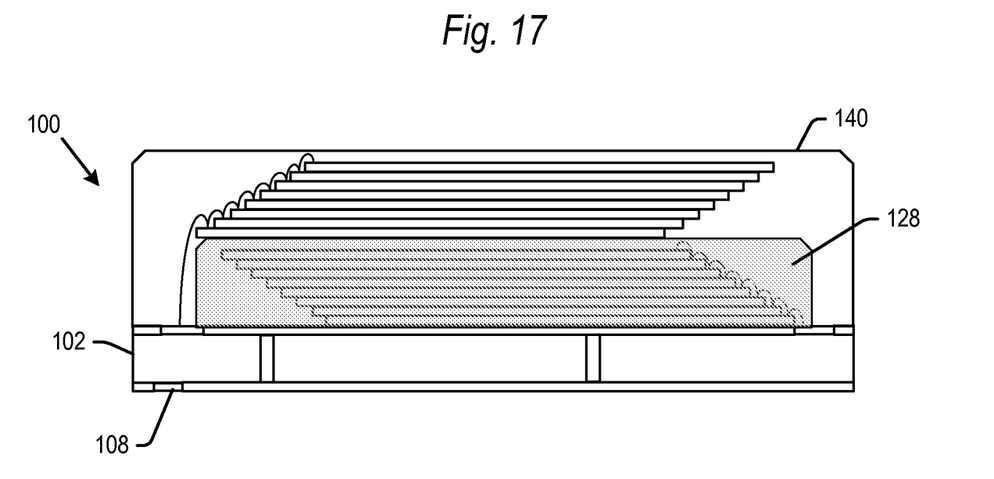
FIGS. 17-18 are side views of a further alternative embodiment of the semiconductor device according to the present technology.
Figure 18:
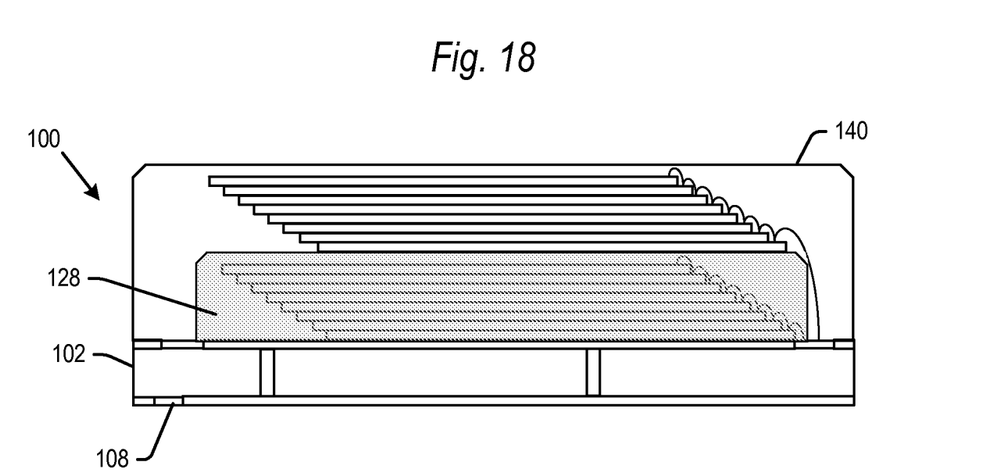

As noted earlier, in embodiments, the intermediate encapsulation step(s) 220 encapsulate a portion of the lower die stack(s) around the wire bonds 130. However, the intermediate encapsulation step(s) 220 may encapsulate any amount of the lower die stack(s), including all of the lower die stack(s), as shown in FIGS. 17-18. In FIG. 17, there are two die stacks shown, with the second one being reverse stepped relative to the first one. The first die stack may be fully encapsulated in mold compound 128, and then the second die stack may be mounted on the upper surface of the mold compound 128. The bottommost die of the second die stack may or may not be thicker than the other die in the second die stack. In FIG. 18, there are two die stacks shown, with the second one being stepped in the same direction as the first one. The first die stack may be fully encapsulated in mold compound 128, and then the second die stack may be mounted on the upper surface of the mold compound 128. The spacer layer 150 described in earlier embodiments may be omitted.

In summary, in one example, the present technology relates to a semiconductor device, comprising: a substrate; a first die stack affixed to the substrate; a first set of wire bonds wire bonding the first die stack to the substrate; a first mold compound encapsulating at least the first set of wire bonds; a second die stack mounted over the first die stack; a second set of wire bonds wire bonding the second die stack to the substrate; a second mold compound encapsulating at least the second die stack, the second set of wire bonds and the first mold compound.

In another example, the present technology relates to a semiconductor device, comprising: a substrate; a first die stack affixed to the substrate; a first set of wire bonds wire bonding the first die stack to the substrate; a first mold compound encapsulating at least the first set of wire bonds; a second die stack mounted over the first mold compound and the first die stack; a second set of wire bonds wire bonding the second die stack to the substrate; a second mold compound encapsulating the second die stack, the second set of wire bonds, the first mold compound and any portion of the first die stack not encapsulated by the first mold compound.

In a further example, the present technology relates to a method of forming a semiconductor device, comprising: (a) mounting a first die stack on a substrate; (b) electrically connecting the first die stack to the substrate; (c) encapsulating at least a portion of the first die stack; (d) testing the functionality of the first die stack; (e) mounting a second die stack on the first die stack if the first die stack functions within defined parameters in said step (d); (f) electrically connecting the second die stack to the substrate; and (g) encapsulating the second die stack in a second encapsulation step.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A semiconductor device, comprising:
    a substrate;
    a first die stack affixed to the substrate;
    a first set of wire bonds wire bonding the first die stack to the substrate;
    a first mold compound encapsulating the first set of wire bonds and less than all of the first die stack;
    a second die stack mounted over the first die stack;
    a second set of wire bonds wire bonding the second die stack to the substrate;
    a second mold compound encapsulating at least the second die stack, the second set of wire bonds and the first mold compound.

2. The semiconductor device of claim 1, wherein the first die stack is stepped in a first direction and the second die stack is stepped in a second, opposite direction.

3. The semiconductor device of claim 2, wherein a bottommost die of the second die stack is thicker than other die in the second die stack.

4. The semiconductor device of claim 1, wherein the first and second die stacks each include eight memory die.

5. The semiconductor device of claim 1, wherein the first and second die stacks each include four memory die.

6. The semiconductor device of claim 1, further comprising a controller die.

7. The semiconductor device of claim 1, wherein the semiconductor device is a land grid array semiconductor package.

8. The semiconductor device of claim 1, wherein the semiconductor device is a ball grid array semiconductor package and further comprises a plurality of solder balls mounted to contact pads on a surface of the substrate opposite a surface including the first and second die stacks.

9. A semiconductor device, comprising:
    a substrate;
    a first die stack affixed to the substrate;
    a first set of wire bonds wire bonding the first die stack to the substrate;
    a first mold compound encapsulating the first set of wire bonds and less than all of the first die stack;
    a second die stack mounted over the first mold compound and the first die stack;
    a second set of wire bonds wire bonding the second die stack to the substrate;
    a second mold compound encapsulating the second die stack, the second set of wire bonds, the first mold compound and any portion of the first die stack not encapsulated by the first mold compound.

10. The semiconductor device of claim 9, wherein a surface of the first mold compound is coplanar with a surface of the bottommost die in the second die stack.

11. A method of forming a semiconductor device, comprising the steps of:
    (a) mounting a first die stack on a substrate;
    (b) electrically connecting the first die stack to the substrate;
    (c) encapsulating a portion of the first die stack, the portion comprising less than all of the first die stack;
    (d) testing the functionality of the first die stack;
    (e) mounting a second die stack on the first die stack if the first die stack functions within defined parameters in said step (d);
    (f) electrically connecting the second die stack to the substrate; and
    (g) encapsulating the second die stack in a second encapsulation step.

12. The method of claim 11, wherein said step (b) comprises wire bonding die bond pads of the semiconductor die in the first die stack to contact pads on the substrate.

13. The method of claim 11, wherein said step (c) comprises encapsulating less than all of the first die stack.

14. The method of claim 11, wherein said step (c) comprises encapsulating all of the first die stack.

15. The method of claim 11, further comprising the step of disabling one or more die that do not function within the defined parameters.

16. A semiconductor device, comprising:
    a substrate;
    a first die stack affixed to the substrate;
    a first set of wire bonds wire bonding the first die stack to the substrate;
    a first mold compound encapsulating at least the first set of wire bonds and less than all of the first die stack;
    a second die stack mounted over the first die stack, a surface of the first mold compound being coplanar with a surface of a bottommost die in the second die stack;
    a second set of wire bonds wire bonding the second die stack to the substrate;
    a second mold compound encapsulating at least the second die stack, the second set of wire bonds and the first mold compound.

17. The semiconductor device of claim 16, wherein the first die stack is stepped in a first direction and the second die stack is stepped in a second, opposite direction.

18. The semiconductor device of claim 17, wherein the bottommost die of the second die stack is thicker than other die in the second die stack.

19. The semiconductor device of claim 16, further comprising a controller die.

20. The semiconductor device of claim 16, wherein the semiconductor device is a land grid array semiconductor package.

21. The semiconductor device of claim 16, wherein the semiconductor device is a ball grid array semiconductor package and further comprises a plurality of solder balls mounted to contact pads on a surface of the substrate opposite a surface including the first and second die stacks.

22. A method of forming a semiconductor device, comprising the steps of:
(a) mounting a first die stack on a substrate;
(b) electrically connecting the first die stack to the substrate;
(c) encapsulating a portion of the first die stack;
(d) testing the functionality of die in the first die stack;
(e) disabling one or more die that do not function within the defined parameters;
(f) mounting a second die stack on the first die stack if the first die stack functions within defined parameters in said step (d);
(g) electrically connecting the second die stack to the substrate; and
(h) encapsulating the second die stack in a second encapsulation step.

23. The method of claim 22, wherein said step (b) comprises wire bonding die bond pads of the semiconductor die in the first die stack to contact pads on the substrate.

24. The method of claim 22, wherein said step (c) comprises encapsulating less than all of the first die stack.

25. The method of claim 22, wherein said step (c) comprises encapsulating all of the first die stack.

* * * * *